United States Patent
Cheng et al.

(10) Patent No.: US 6,638,866 B1
(45) Date of Patent: Oct. 28, 2003

(54) CHEMICAL-MECHANICAL POLISHING (CMP) PROCESS FOR SHALLOW TRENCH ISOLATION

(75) Inventors: Juing-Yi Cheng, Chi Shange (TW); Kevin Su, Jubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 110 days.

(21) Appl. No.: 09/981,436

(22) Filed: Oct. 18, 2001

(51) Int. Cl.[7] ............................................. H01L 21/302
(52) U.S. Cl. ........................................ 438/692; 438/693
(58) Field of Search ................................. 438/689, 690, 438/691, 692, 693; 252/79.1

(56) References Cited

U.S. PATENT DOCUMENTS

| | | | |
|---|---|---|---|
| 5,837,612 A | 11/1998 | Ajuria et al. | 438/697 |
| 5,889,335 A | 3/1999 | Kuroi et al. | 257/797 |
| 5,930,645 A | 7/1999 | Lyons et al. | 438/424 |
| 5,950,093 A | 9/1999 | Wei | 438/401 |
| 5,994,201 A | 11/1999 | Lee | 438/427 |
| 6,015,757 A * | 1/2000 | Tsai et al. | 438/697 |
| 6,017,803 A * | 1/2000 | Wong | 438/430 |
| 6,043,133 A | 3/2000 | Jang et al. | 438/401 |
| 6,069,081 A * | 5/2000 | Kelleher et al. | 438/692 |
| 6,107,159 A | 8/2000 | Chuang | 438/432 |
| 6,165,854 A | 12/2000 | Wu | 438/296 |
| 6,410,403 B1 * | 6/2002 | Wu | 438/424 |
| 6,528,389 B1 * | 3/2003 | Allman et al. | 438/424 |

* cited by examiner

Primary Examiner—Kin-Chan Chen
(74) Attorney, Agent, or Firm—George O. Saile; Stephen B. Ackerman; Rosemary L. S. Pike

(57) ABSTRACT

A method of forming shallow trench isolation using CMP is described. A pad oxide layer is grown overlying a silicon semiconductor substrate. A polysilicon layer and a nitride layer are deposited. Trenches are etched through the nitride layer, polysilicon layer, and pad oxide layer into the silicon semiconductor substrate and filled with an oxide layer. A silicon oxynitride layer is deposited overlying the oxide layer. A first polishing is performed to polish away the silicon oxynitride layer and oxide layer using a first slurry having high selectivity of oxide to nitride. A second polishing is performed to polish away the oxide layer using a second slurry having a low selectivity of oxide to nitride. The nitride layer is removed and a third polishing is performed to planarize the oxide layer using a third slurry having high selectivity of oxide to polysilicon.

24 Claims, 6 Drawing Sheets

CHEMICAL-MECHANICAL POLISHING (CMP) PROCESS FOR SHALLOW TRENCH ISOLATION

BACKGROUND OF THE INVENTION (1) Field of the Invention

The invention relates to a method of forming shallow trench isolation in the fabrication of integrated circuits, and more particularly, to a method of forming planarized shallow trench isolation in the fabrication of integrated circuits.

(2) Description of the Prior Art

Shallow trench isolation (STI) is desirable for improved planarity over other isolation techniques. Chemical-mechanical polishing (CMP) processes are key to forming STI regions. However, a reverse mask is often needed to form STI due to low CMP selectivity for oxide to nitride and the dishing effect at wide field regions. Therefore, to overcome these problems, a slurry having a high selectivity of oxide to nitride and high planarity is needed. Furthermore, a high selectivity CMP process can induce macro or micro-scratches. Thus, reducing scratches is also an important topic. Another issue for STI CMP is pattern density effect. This will result in a large variation in trench oxide thickness after CMP which leads to difficulties in controlling polysilicon photolithography and etching. It is desired to find a process to resolve all of these critical issues.

U.S. Pat. 6,043,133 to Jang et al shows a CMP STI process with reverse mask. U.S. Pat. No. 6,107,159 to Chuang, U.S. Pat. No. 5,837,612 to Ajuria, U.S. Pat. No. 5,950,093 to Wei, and U.S. Pat. No. 5,889,335 to Kuroi et al show other STI processes.

SUMMARY OF THE INVENTION

A principal object of the present invention is to provide an effective and very manufacturable method of forming shallow trench isolation device in the fabrication of an integrated circuit.

Another object of the present invention is to provide an effective and very manufacturable method of forming shallow trench isolation using chemical mechanical polishing (CMP) wherein a low pattern-density effect is achieved.

Another object of the present invention is to form shallow trench isolation using CMP wherein there is minimal trench oxide thickness variation.

A further object of the invention is to form shallow trench isolation using CMP to achieve direct and low-defect CMP process.

A still further object is to form shallow trench isolation using CMP wherein subsequent polysilicon photolithography and etching difficulties are minimized.

In accordance with the objects of this invention a new method of forming shallow trench isolation using CMP is achieved. A pad oxide layer is grown overlying a silicon semiconductor substrate. A polysilicon layer is: deposited overlying the pad oxide layer. A nitride layer is deposited overlying the polysilicon layer. Trenches are etched through the nitride layer, polysilicon layer, and pad oxide layer into the silicon semiconductor substrate. The trenches are filled with an oxide layer wherein the oxide layer extends above a top surface of the nitride layer. In one alternative, a silicon oxynitride layer is deposited overlying the oxide layer. A first polishing is performed to polish away the silicon oxynitride layer and oxide layer using a first slurry having high selectivity of oxide to nitride. A second polishing is performed to polish away the oxide layer using a second slurry having a low selectivity of oxide to nitride and having low-defect properties. The silicon nitride layer is removed, and a third high-selectivity slurry is used to planarize the oxide layer to the polysilicon surface to complete formation of shallow trench isolations. In a second alternative, the oxide layer is etched away except where it overlies the trench areas. Then, a first polishing is performed to polish away the oxide layer using a first slurry having a low selectivity of oxide to nitride and having low-defect properties. The nitride layer is removed and then a second polishing is performed to planarize the oxide layer to the polysilicon layer using a second slurry having high selectivity of oxide to polysilicon to complete formation of shallow trench isolations.

BRIEF DESCRIPTION OF THE DRAWINGS

In the accompanying drawings forming a material part of this description, there is shown.

DESCRIPTION OF THE PREFERRED EMBODIMENTS

Figure 1:
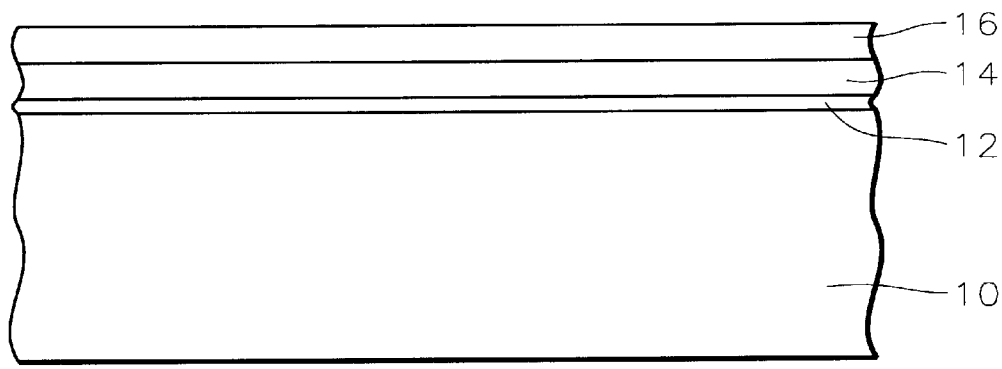
FIGS. 1 through 3 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. A layer of pad oxide 12 is grown on the surface of the substrate to a thickness of between about 50 and 500 Angstroms. Now, a polysilicon buffer layer 14 is deposited over the pad oxide layer 12, preferably by low pressure chemical vapor deposition (LPCVD), to a thickness of between about 100 and 1000 Angstroms. Now, a silicon nitride layer 16 is deposited over the polysilicon buffer layer to a thickness of between about 500 and 2000 Angstroms. The silicon nitride layer is preferably deposited by LPCVD and serves as a hard mask layer.

Figure 2:
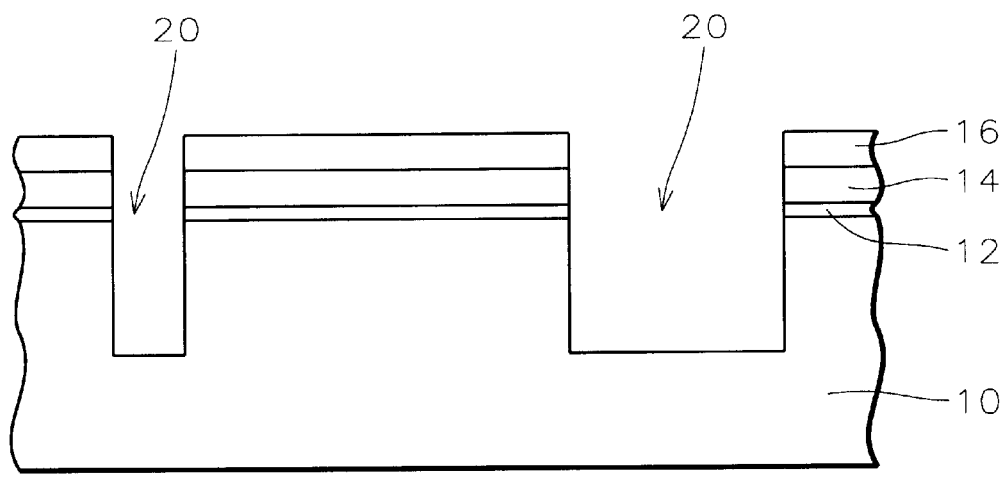

Active areas are defined and isolation trenches 20 are etched through the layers 16/14/12 and into the substrate, as illustrated in FIG. 2. The photoresist, not shown, is stripped and the wafers are cleaned, as is conventional.

Figure 3:
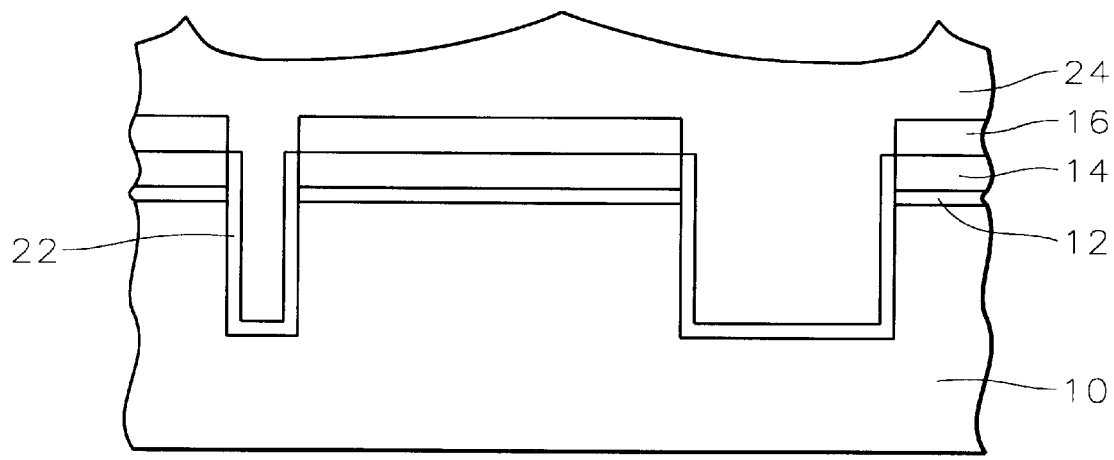

Now, referring to FIG. 3, a liner oxide layer 22 is grown by wet or dry oxidation within the trenches 20. Now, the trenches are filled with oxide layer 24, such as by chemical vapor deposition (CVD) or high-density plasma CVD.

Now the key features of the invention will be described wherein the novel CMP process achieves a low pattern-density effect, reduced oxide thickness variation, and reduced polysilicon photolithography and etching difficulty.

Figure 4:
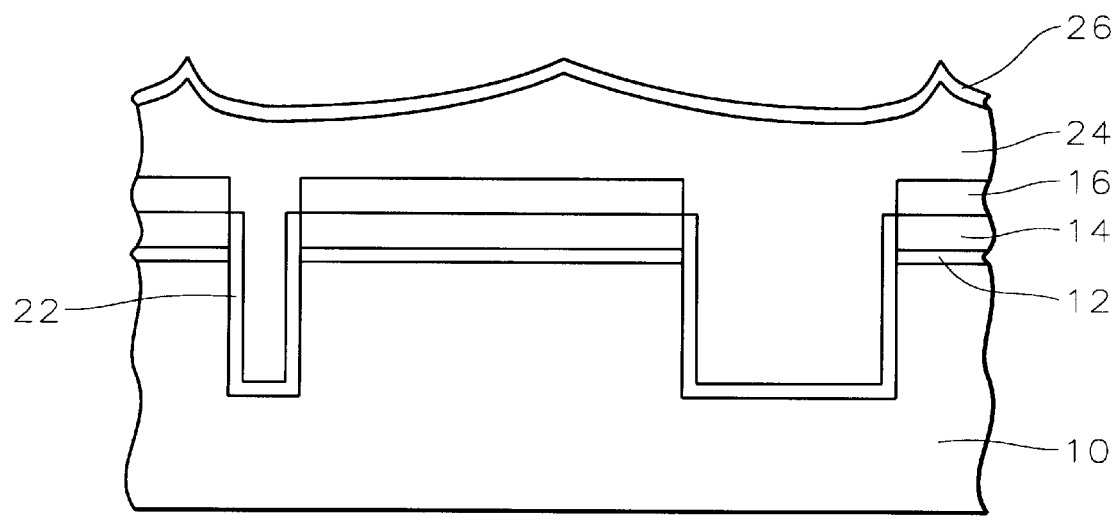
FIGS. 4 through 8 schematically illustrate in cross-sectional representation a first alternative in a preferred embodiment of the present invention.
Figure 5:
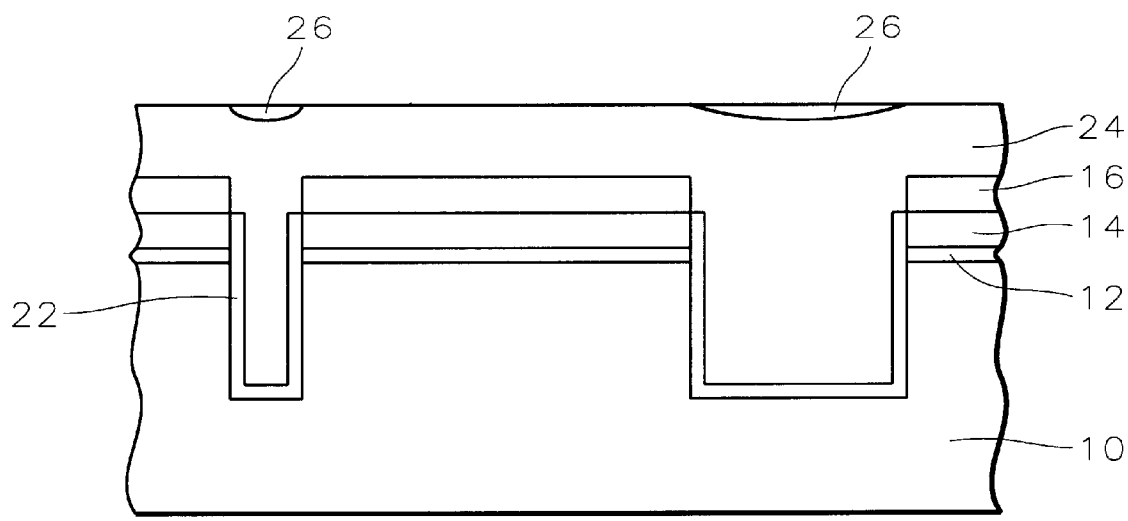
Figure 6:
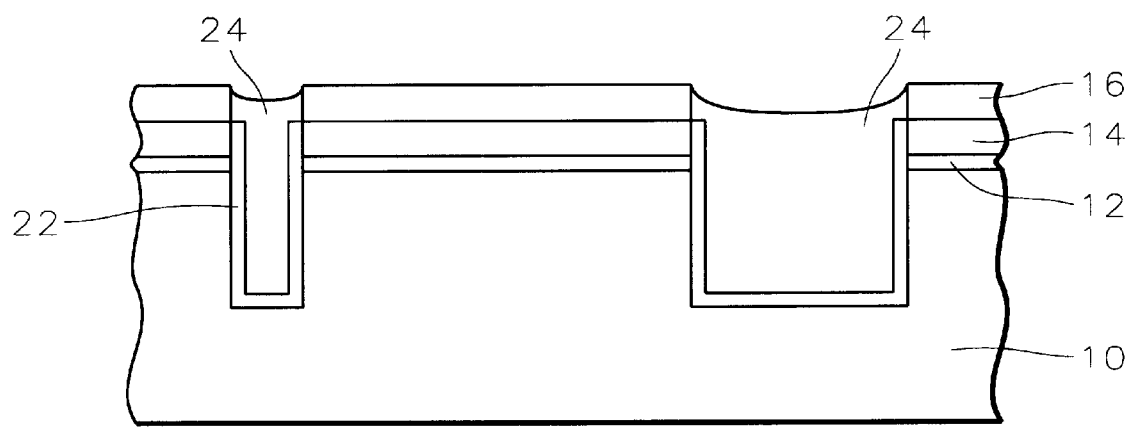

FIGS. 4–6 illustrate a first alternative CMP process is used. As shown in FIG. 4, a silicon oxynitride layer 26 is deposited over the trench fill oxide layer 24. This SiON layer is deposited by plasma-enhanced chemical vapor deposition (PECVD) to a thickness of between about 50 and 1500 Angstroms. The SiON layer 24 will serve as a CMP polish stop layer at the wide field regions to improve planarization. Alternatively, this layer may be another material such as a second silicon nitride layer.

In a first step, chemical mechanical polishing (CMP) is performed using a slurry having a high selectivity for oxide with respect to nitride. The slurry has a selectivity of greater than 10. The layer 26 acts as a polish stop layer. Polishing stops when the oxide 24 is exposed, leaving the SiON layer only over the trench areas, as shown in FIG. 5.

Figure 7:
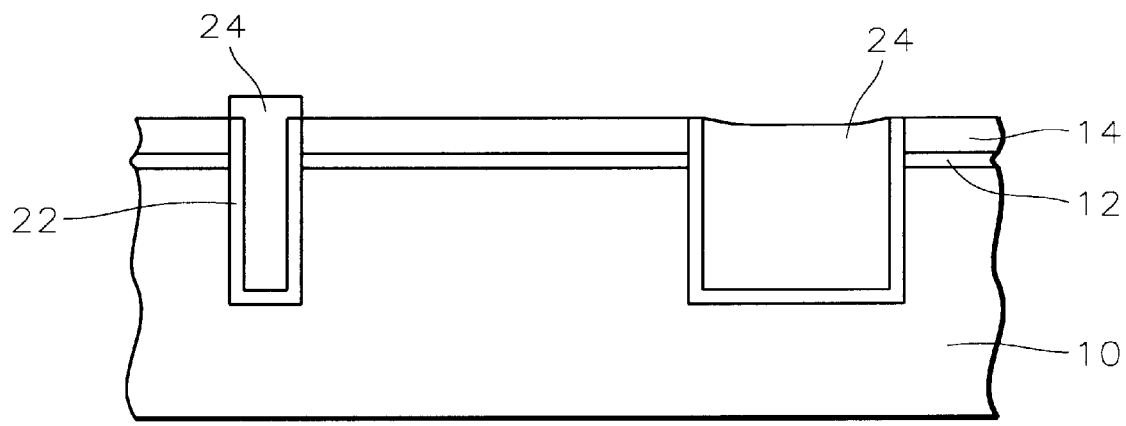

In a second step, CMP is continued with a low-defect and low-selectivity slurry. This second slurry has a selectivity of oxide to nitride of lower than 3. The second slurry preferably uses silica-based particles for low defects. FIG. 6 illustrates the wafer after the second CMP step has been completed. Polishing stops on the silicon nitride layer 16. Then, the silicon nitride layer 16 is removed by a wet etch, such as hot $H_3PO_4$, as shown in FIG. 7.

Figure 8:
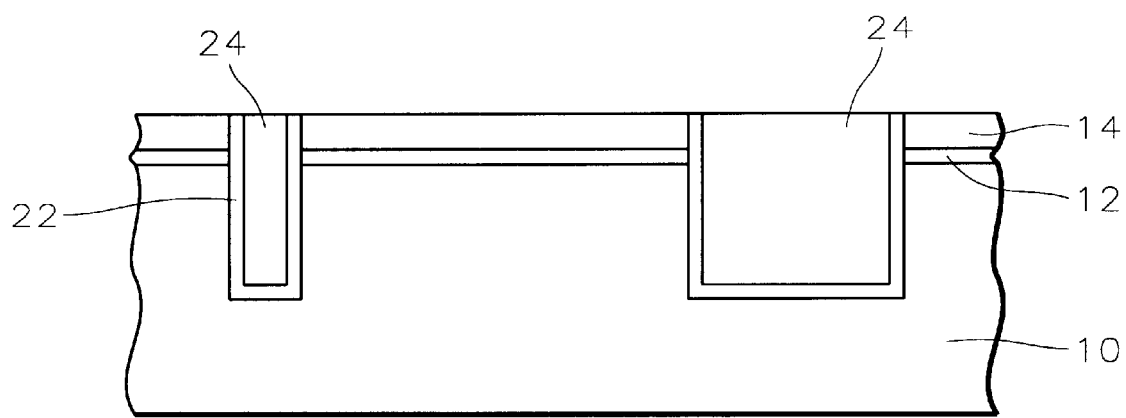

In a third step, CMP is continued with a high-selectivity and planarity slurry. This third slurry has a selectivity of oxide to polysilicon of greater than 3. Moreover, a low downforce recipe is used to achieve planarization. FIG. 8 illustrates the wafer after the third CMP step has been completed.

The process of the present invention avoids dishing. The first polishing step planarizes the surface of the oxide layer, thus allowing the second polishing step to be performed without dishing. After the second CMP step, the silicon nitride layer is removed by a wet etch. The third polishing step planarizes the oxide to the polysilicon layer.

Figure 9:
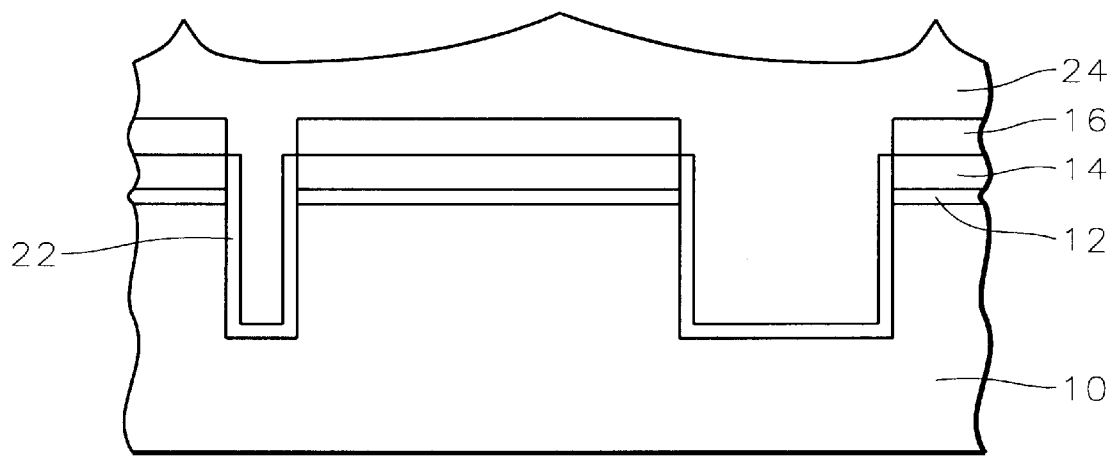
FIGS. 9 through 13 schematically illustrate in cross-sectional representation a second alternative in a preferred embodiment of the present invention.
Figure 10:
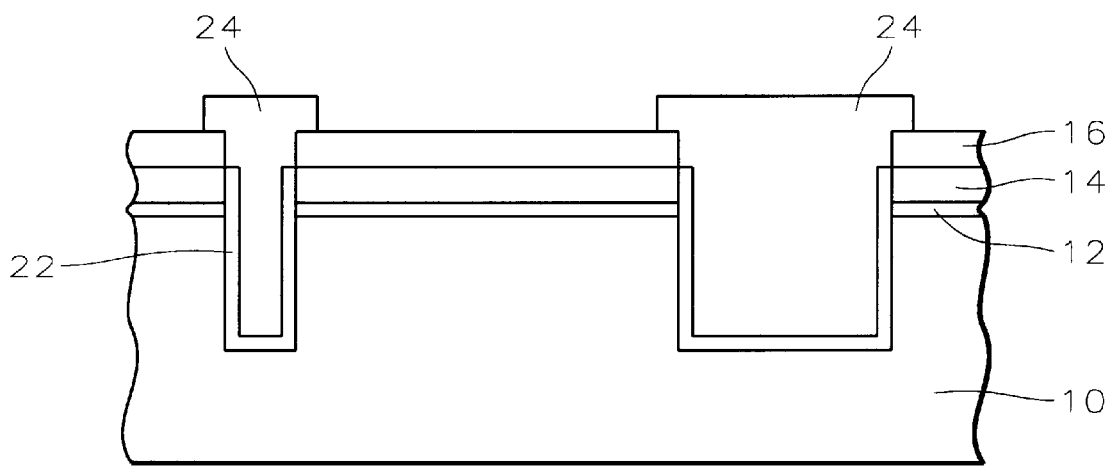

FIGS. 9–13 illustrate a second alternative CMP process. FIG. 9 shows the oxide layer 24 to be planarized. In this alternative, an oxide-defined reverse (ODR) tone masking process is used. The ODR process of the present invention is more easily performed and has a larger process window than in the prior art. The oxide layer 24 and a portion of the nitride layer 16 is dry-etched away where they are not covered by a mask, not shown. As shown in FIG. 10, the oxide 24 remains only in the area of the trenches.

Figure 11:
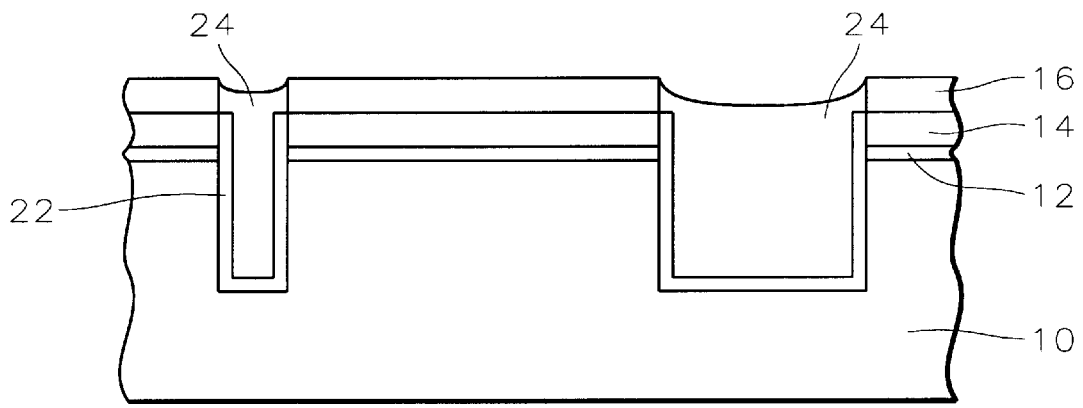

Now, the oxide 24 is to be planarized. In a first step, chemical mechanical polishing (CMP) is performed using a low-defect, low-selectivity slurry. The slurry has a selectivity of oxide with respect to nitride of greater than 3. The slurry preferably uses silica particles for low defects. The first polishing step is stopped when a desired oxide thickness is reached, as shown in FIG. 11. The silicon nitride layer 16 may be partially removed in this first polishing step.

Figure 12:
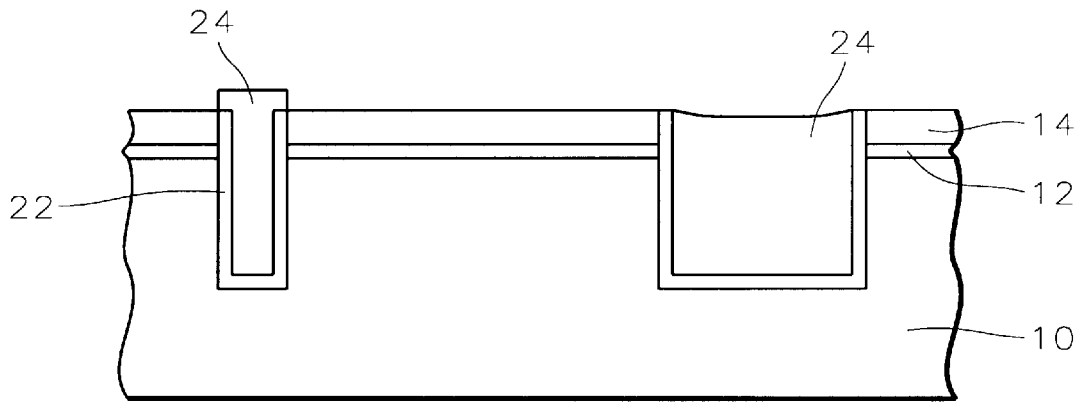

Now, the silicon nitride layer 16 is removed by a wet etch, such as hot $H_3PO_4$, as shown in FIG. 12.

Figure 13:
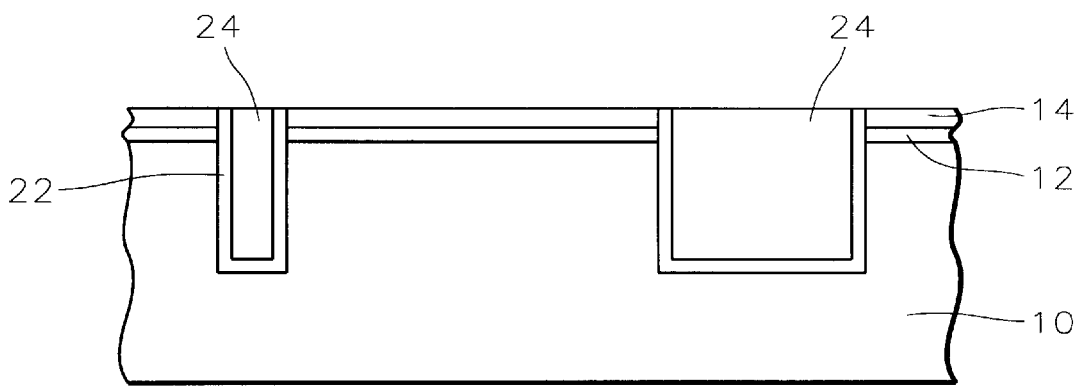

In a second step, CMP is continued with a high-selectivity, high-planarity slurry. This second slurry has a selectivity of oxide to nitride of greater than 10 and oxide to polysilicon of greater than 3. A low downforce recipe is used in this step where the downforce is half the normal downforce. FIG. 13 illustrates the wafer after the second CMP step has been completed. The polysilicon layer 14 may be partially removed in this second polishing step, but the pad oxide layer is not exposed.

The process of the present invention avoids dishing. Most of the trench oxide thickness remaining after ODR etching is polished away using the high-selectivity slurry, and therefore, a high oxide polishing rate. The silicon nitride layer is removed. Then the second polishing step is performed at a lower polishing rate, thus avoiding dishing.

The process of the invention provides two alternative methods for forming shallow trench isolation using CMP processes. Both methods avoid the use of reverse masks, reduce dishing and oxide thickness variation, and reduce scratches, resulting in better control of subsequent polysilicon photolithography and etching.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolations in the fabrication of an integrated circuit device comprising:
    growing a pad oxide layer overlying a silicon semiconductor substrate;
    depositing a polysilicon layer overlying said pad oxide layer;
    depositing a nitride layer overlying said polysilicon layer;
    etching trenches through said nitride layer, said polysilicon layer, and said pad oxide layer into said silicon semiconductor substrate;
    filling said trenches with an oxide layer wherein said oxide layer extends above a top surface of said nitride layer;
    depositing a stop layer overlying said oxide layer;
    first polishing away said stop layer and said oxide layer using a first slurry having high selectivity of oxide to nitride;
    second polishing away said oxide layer using a second slurry having a low selectivity of oxide to nitride and having low-defect properties;
    removing said nitride layer; and
    thereafter third polishing away said oxide layer using a third slurry having a high selectivity of oxide to polysilicon to complete formation of said shallow trench isolations in said fabrication of said integrated circuit device.

2. The method according to claim 1 wherein said polysilicon layer has a thickness of between about 100 and 1000 Angstroms.

3. The method according to claim 1 wherein said nitride layer comprises silicon nitride and has a thickness of between about 500 and 2000 Angstroms.

4. The method according to claim 1 further comprising growing a liner oxide layer within said trenches before said step of depositing said oxide layer.

5. The method according to claim 4 wherein said liner oxide layer and has a thickness of between about 50 and 300 Angstroms.

6. The method according to claim 1 wherein said oxide layer is deposited by chemical vapor deposition.

7. The method according to claim 1 wherein said oxide layer is deposited by high density plasma chemical vapor deposition.

8. The method according to claim 1 wherein said stop layer is selected from the group consisting of: silicon oxynitride and silicon nitride and wherein said stop layer has a thickness of between about 50 and 1500 Angstroms.

9. The method according to claim 1 wherein said first slurry has a selectivity of oxide to nitride of greater than 10.

10. The method according to claim 1 wherein said second slurry has a selectivity of oxide to nitride of lower than 3.

11. The method according to claim 1 wherein said second slurry uses silica-based particles to achieve said low-defect properties.

12. The method according to claim 1 wherein said third slurry has a selectivity of oxide to polysilicon of greater than 10.

13. The method according to claim 1 wherein said third polishing step uses a downforce of no more than half a conventional downforce.

14. A method of forming shallow trench isolations in the fabrication of an integrated circuit device comprising:

growing a pad oxide layer overlying a silicon semiconductor substrate;

depositing a polysilicon layer overlying said pad oxide layer;

depositing a nitride layer overlying said polysilicon layer;

etching trenches through said nitride layer, said polysilicon layer, and said pad oxide layer into said silicon semiconductor substrate;

filling said trenches with an oxide layer wherein said oxide layer extends above a top surface of said nitride layer;

depositing a silicon oxynitride layer overlying said oxide layer;

first polishing away said silicon oxynitride layer and said oxide layer using a first slurry having high selectivity of oxide to nitride;

second polishing away said oxide layer using a second slurry having a low selectivity of oxide to nitride and having low-defect properties;

removing said nitride layer; and thereafter third polishing away said oxide layer using a third slurry having a high selectivity of oxide to polysilicon to complete formation of said shallow trench isolations in said fabrication of said integrated circuit device.

15. The method according to claim 14 wherein said polysilicon layer has a thickness of between about 100 and 1000 Angstroms.

16. The method according to claim 14 wherein said nitride layer comprises silicon nitride and has a thickness of between about 500 and 2000 Angstroms.

17. The method according to claim 14 further comprising growing a liner oxide layer within said trenches before said step of depositing said oxide layer.

18. The method according to claim 17 wherein said liner oxide layer and has a thickness of between about 50 and 300 Angstroms.

19. The method according to claim 14 wherein said oxide layer is deposited by one of the group consisting of: chemical vapor deposition and high density plasma chemical vapor deposition.

20. The method according to claim 14 wherein said silicon oxynitride layer has a thickness of between about 50 and 1500 Angstroms.

21. The method according to claim 14 wherein said first slurry has a selectivity of oxide to nitride of greater than 10.

22. The method according to claim 14 wherein said second slurry has a selectivity of oxide to nitride of lower than 3 and wherein said second slurry uses silica-based particles.

23. The method according to claim 14 wherein said third slurry has a selectivity of oxide to polysilicon of greater than 10.

24. The method according to claim 14 wherein said third polishing step uses a downforce of no more than half a conventional downforce.

* * * * *